US 9,515,652 B2

(12) United States Patent
Ohtani et al.

(10) Patent No.: US 9,515,652 B2
(45) Date of Patent: Dec. 6, 2016

(54) RELAY MODULE DEVICE (71) Applicant: Anden Co., Ltd., Anjo, Aichi-pref. (JP)

(72) Inventors: Hideyuki Ohtani, Nisshin (JP); Naoyuki Yasuda, Okazaki (JP)

(73) Assignee: Anden Co., Ltd., Anjo, Aichi-pref. (JP)

( * ) Notice: Subject to any disclaimer, the term of this patent is extended or adjusted under 35 U.S.C. 154(b) by 0 days.

(21) Appl. No.: 14/606,447

(22) Filed: Jan. 27, 2015

(65) Prior Publication Data
US 2015/0222265 A1 Aug. 6, 2015

(30) Foreign Application Priority Data

Jan. 31, 2014 (JP) .................................. 2014-016961

(51) Int. Cl.
*H03K 17/693* (2006.01)
*H03K 17/687* (2006.01)
*H05K 3/34* (2006.01)

(52) U.S. Cl.
CPC ........ *H03K 17/693* (2013.01); *H03K 17/6874* (2013.01); *H03K 17/6877* (2013.01); *H05K 3/3426* (2013.01); *H05K 2201/10053* (2013.01); *H05K 2201/1081* (2013.01); *H05K 2201/10295* (2013.01); *H05K 2201/10803* (2013.01); *H05K 2201/10833* (2013.01); *H05K 2201/10871* (2013.01); *Y02P 70/613* (2015.11)

(58) Field of Classification Search
CPC ....... H03K 17/693; H05K 1/141; H05K 1/183
USPC .......................... 361/733, 736, 752, 760, 781
See application file for complete search history.

(56) References Cited

U.S. PATENT DOCUMENTS 6,377,468 B1 4/2002 Ohtani et al.
2013/0252473 A1* 9/2013 Dickey ............... H01R 13/514
439/651

FOREIGN PATENT DOCUMENTS

JP 2001-060750 3/2001

* cited by examiner

*Primary Examiner* — Tuan T Dinh
*Assistant Examiner* — Mukund G. Patel
(74) *Attorney, Agent, or Firm* — Harness, Dickey & Pierce, P.L.C.

(57) ABSTRACT

In a relay module device, a signal converting section transmits driving signals of switching elements when receiving input signals from an external device and sets a relationship between the input signals and the driving signals. The relationship includes a first mode in which the signal converting section transmits the driving signals to separately control one of the switching elements with respect to one of the input signals, and a second mode in which the signal converting section transmits the driving signals to concurrently control two or more of the switching elements with respect to one of the input signals.

14 Claims, 6 Drawing Sheets

RELAY MODULE DEVICE

CROSS REFERENCE TO RELATED APPLICATIONS

The present application is based on and claims priority to Japanese Patent Application No. 2014-16961 filed on Jan. 31, 2014, the contents of which are incorporated in their entirety herein by reference.

TECHNICAL FIELD

The present disclosure relates to a relay module device.

BACKGROUND

JP-A-2001-060750 (corresponding to U.S. Pat. No. 6,377,468) discloses a relay module device in which a connecter terminal is joined to a circuit substrate, such as a printed circuit board including elements and an electrical circuit for forming a relay, and the connecter terminal is pulled out to the outside of a casing including a connector housing so that the connecter terminal can be electrically connected with an external device.

In cases where the number of loads switched by the relay (hereafter, referred to as load number) and an electric current supplied to the loads (hereafter, referred to as load currents) are different, the circuit substrate, the connector housing, the connector terminal, and the casing in the relay module device are generally changed. In other words, in cases where the load number and the load currents are different, a different circuit substrate, a different connector housing, a different connector terminal, and a different casing are prepared.

However, new components need to be prepared for each kind of device in accordance with the load number and the load currents. Thus, a layout design of the circuit substrate and molding tools for the connector housing and the casing are required for each kind of device, and increase in manufacturing cost is caused. In addition, if a wiring pattern of the electrical circuit included in the circuit substrate is changed, influence on a vehicle noise (emission and immunity) is changed. Thus, even in cases where the same electronic components are mounted, an evaluation test similar to a new product is required, and a time and a cost for product development increase. Therefore, it is desired to commonize a circuit substrate in plural kinds of relay module devices having different load numbers and different electric currents.

SUMMARY

An object of the present disclosure is to provide a relay module device to which a common circuit substrate can be applied even when a load number or a load current is different.

A relay module device according to an aspect of the present disclosure includes a circuit substrate, a plurality of connector terminals, and a connector housing. The circuit substrate includes a plurality of switching elements, a plurality of first wiring patterns, a plurality of second wiring patterns, a plurality of terminals, and a signal converting section. The switching elements controls a plurality of load currents supplied from a power source to a plurality of loads. The first wiring patterns transmits driving signals from the signal converting section to the switching elements. The second wiring patterns transmits the load currents from the switching elements to the loads. The terminals are connected with the second wiring patterns. The signal converting section transmits the driving signals when receiving input signals from an external device and sets a relationship between the input signals and the driving signals. The relationship includes a first mode in which the signal converting section transmits the driving signals to separately control one of the switching elements with respect to one of the input signals, and a second mode in which the signal converting section transmits the driving signals to concurrently control two or more of the switching elements with respect to one of the input signals. Each of the connector terminals has an end connected with one of the terminals of the circuit substrate and another end for external connection. The connector housing has a plurality of through holes into which the connecter terminals are fitted.

The circuit substrate includes the signal converting section that sets the relationship between the input signals and the driving signals, and the signal converting section sets the first mode in which each of the switching elements is on-off controlled one by one and the second mode in which two or more of the switching elements are concurrently controlled. Thus, the circuit substrate can be commonized between relay module devices having different load numbers and different load currents.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

The following describes embodiments of the present disclosure with reference to the drawings. In each of the following embodiments, the same or equivalent parts will be described with being designated by the same reference numerals.

First Embodiment

The following describes a first embodiment of the present disclosure. In the present embodiment, a circuit substrate and a connector housing are commonized between two kinds of relay module devices (i.e., a first relay module device 1 and a second relay module device 2) having different load numbers and different electric currents.

Figure 1:
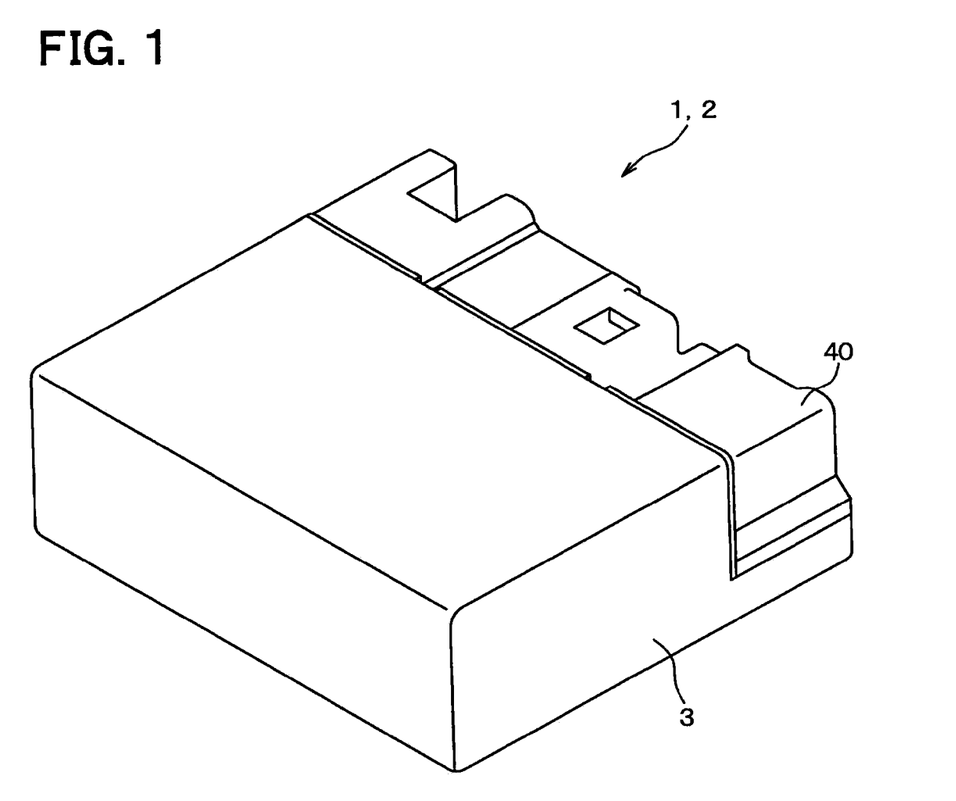
FIG. 1 is a perspective view of each of a first relay module device and a second relay module device according to a first embodiment.
Figure 2A:
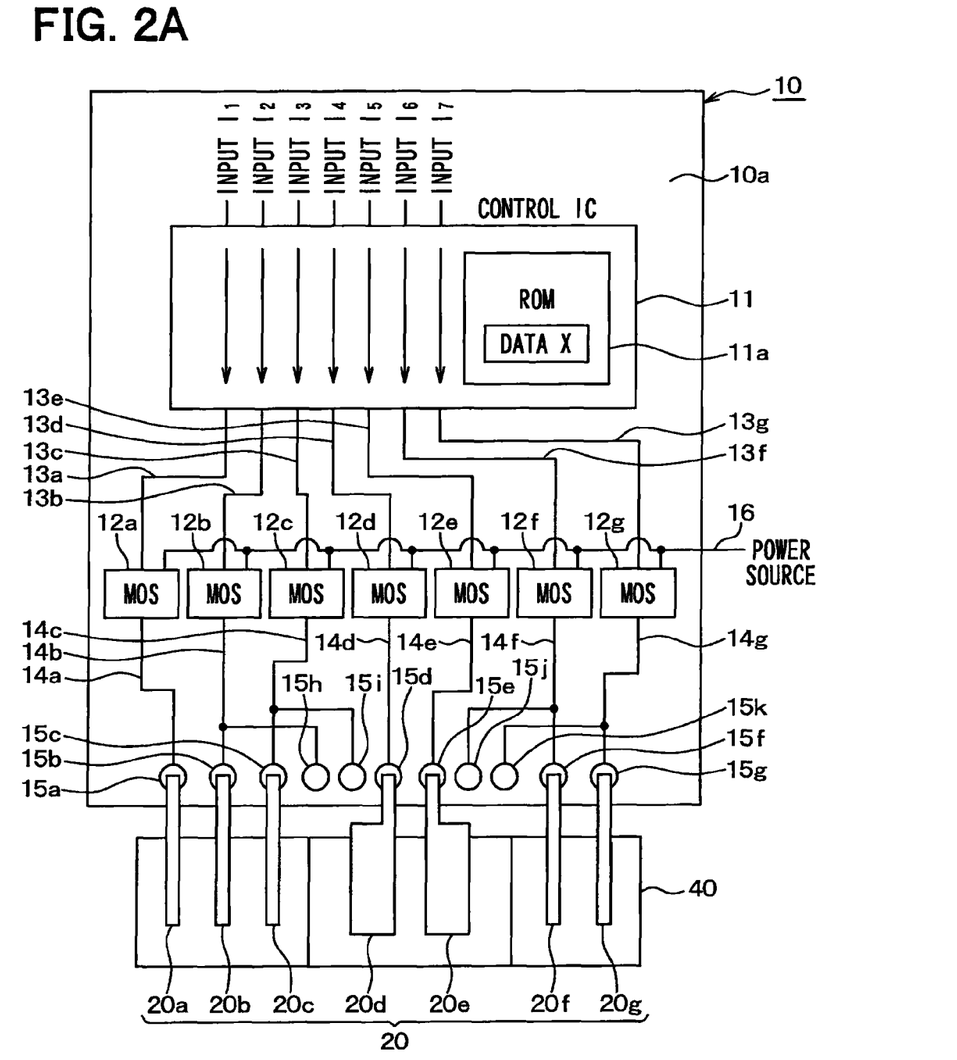
FIG. 2A is a diagram illustrating a schematic structure of a circuit substrate, a connector terminal group, and a connector housing including in the first relay module device.
Figure 2B:
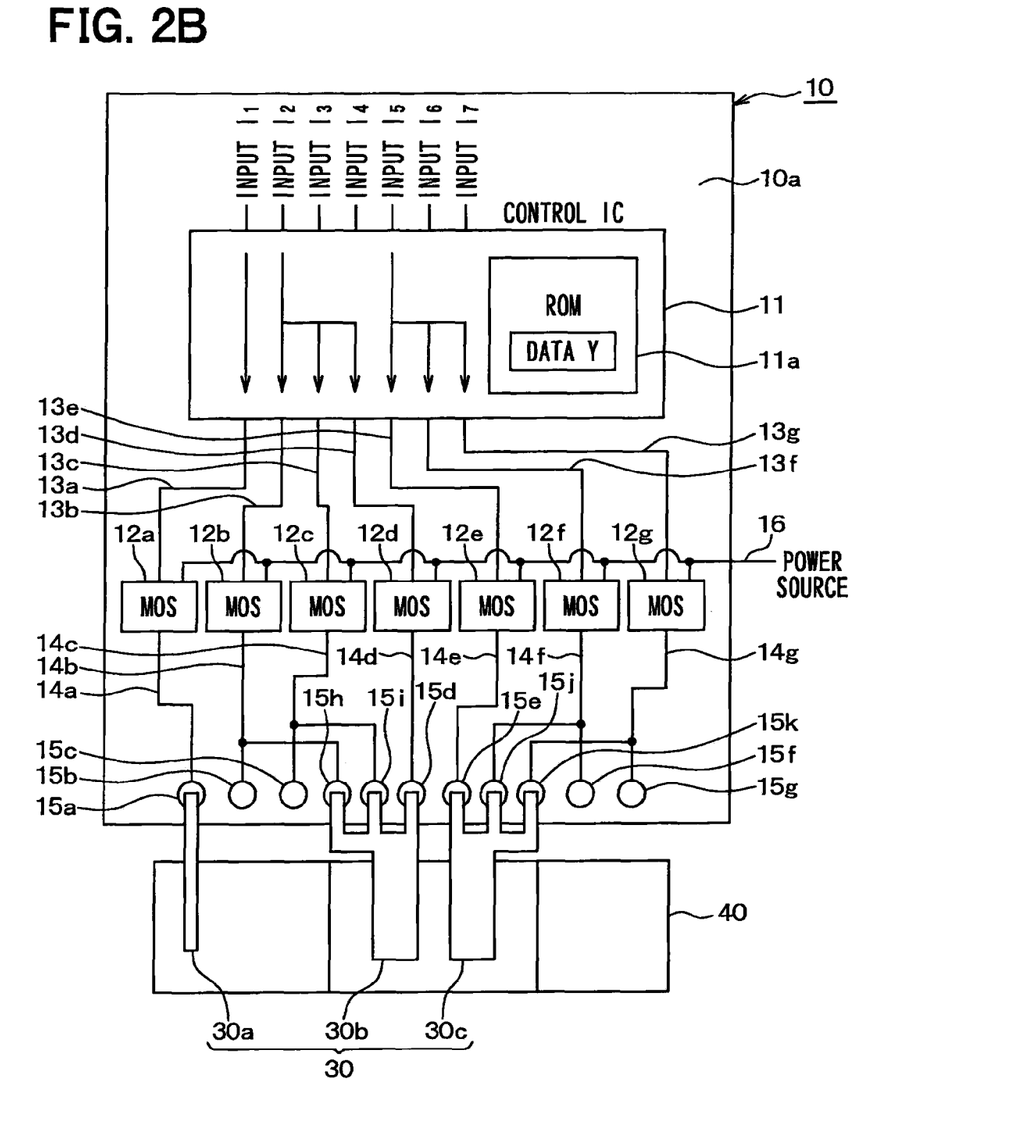
FIG. 2B is a diagram illustrating a schematic structure of a circuit substrate, a connector terminal group, and a connector housing including in the second relay module device.
Figure 3A:
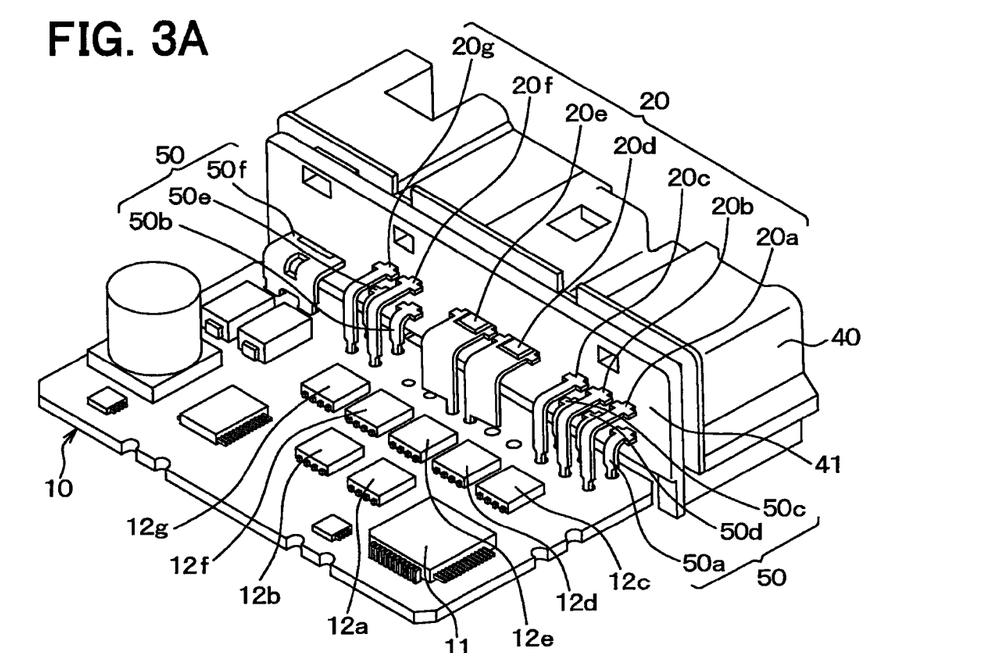
FIG. 3A is a partial perspective view of the first relay module device in which the circuit substrate, the connector terminal group, and the connector housing are taken out.
Figure 3B:
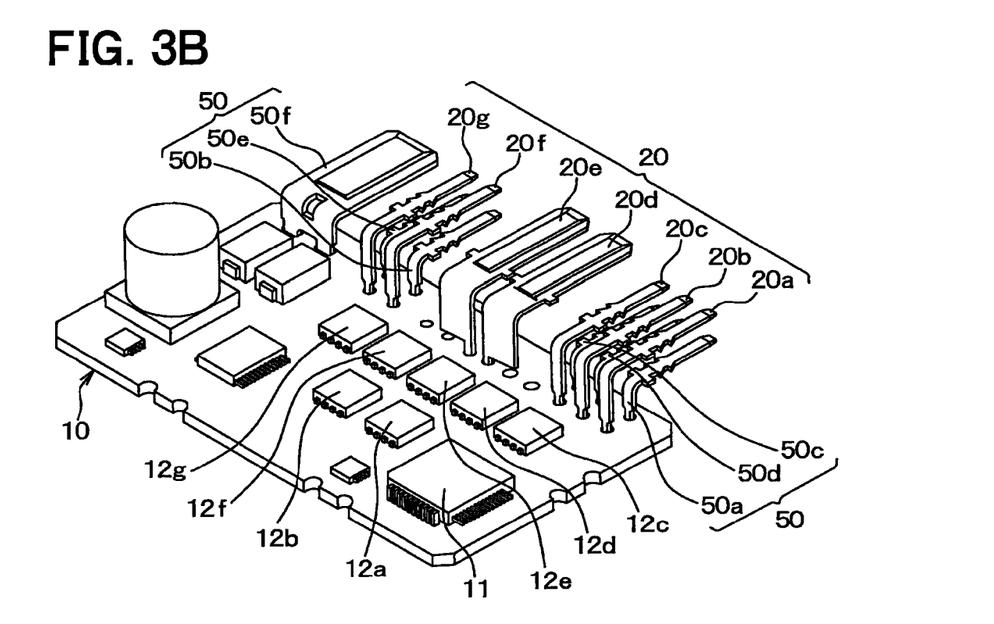
FIG. 3B is a partial perspective view of the first relay module device in which the connector housing is removed from FIG. 3A.
Figure 4A:
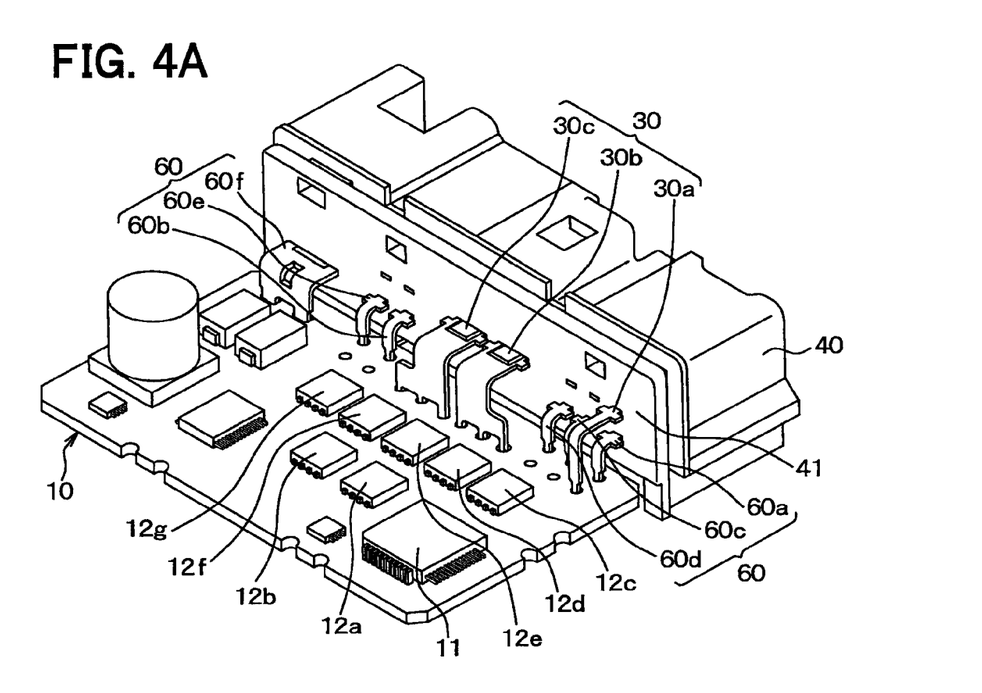
FIG. 4A is a partial perspective view of the second relay module device in which the circuit substrate, the connector terminal group, and the connector housing are taken out.
Figure 4B:
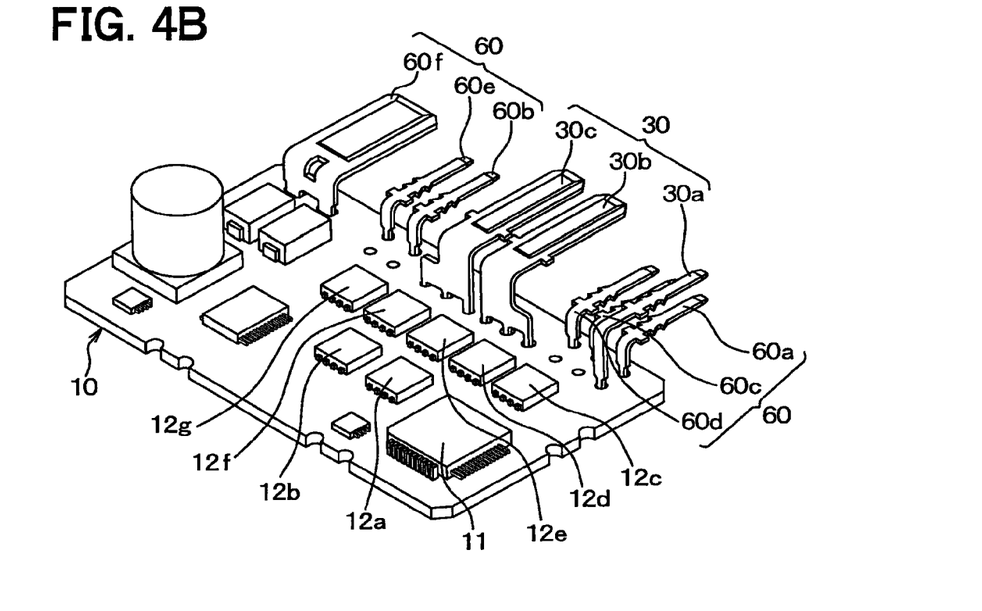
FIG. 4B is a partial perspective view of the second relay module device in which the connector housing is removed from FIG. 4A.
Figure 5A:
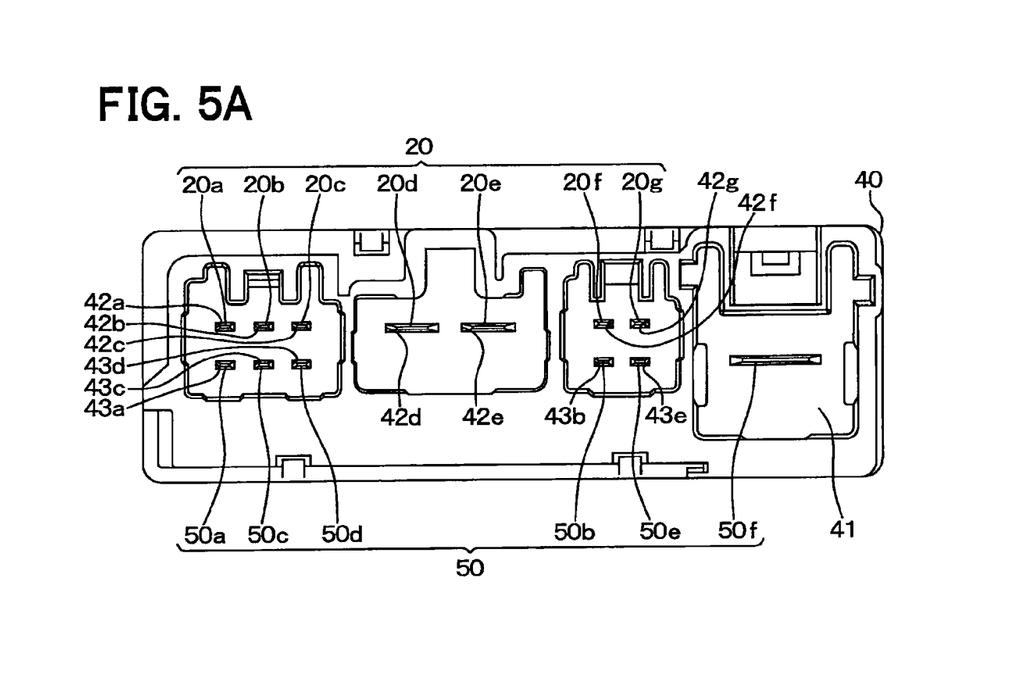
FIG. 5A is a diagram illustrating the first relay module device viewed from a side of the connector housing.
Figure 5B:
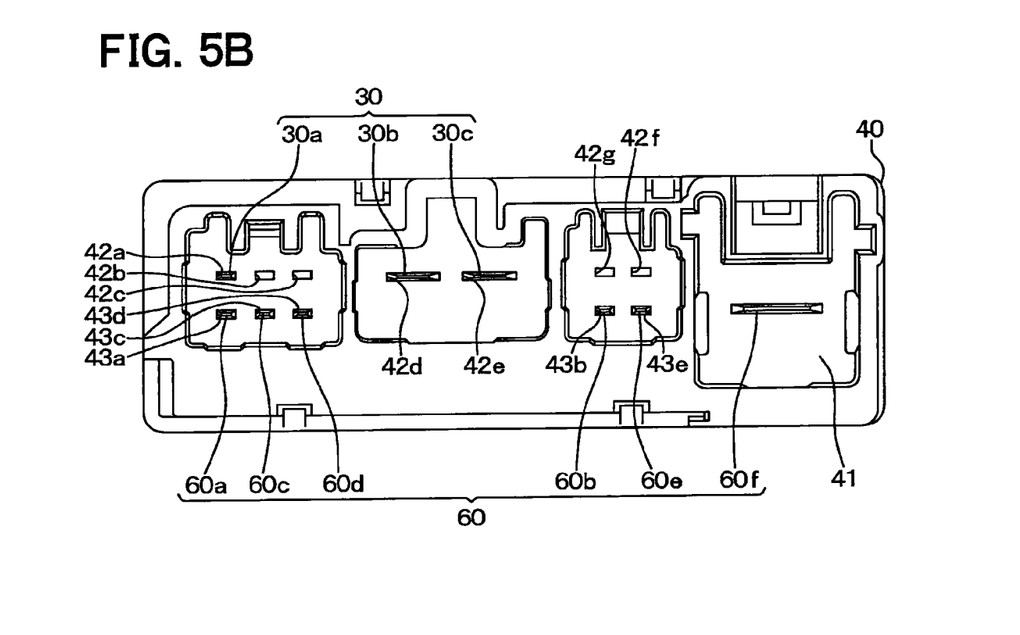
FIG. 5B is a diagram illustrating the second relay module device viewed from a side of the connector housing.

FIG. 1 is a perspective view of each of the first relay module device 1 and the second relay module device 2. FIG. 2A and FIG. 2B are diagrams respectively illustrating schematic structures of a circuit substrate 10, a connector terminal group 20 or 30, and a connector housing 40 including in the first relay module device 1 and the second relay module device 2. FIG. 3A and FIG. 4A are partial perspective views of the first relay module device 1 and the second relay module device 2 in which the circuit substrate 10, the connector terminal group 20 or 30, and the connector housing 40 are taken out. FIG. 3B and FIG. 4B are partial perspective views of the first relay module device 1 and the second relay module device 2 in which the connector housing 40 is removed from FIG. 3A and FIG. 4A. FIG. 5A and FIG. 5B are diagrams respectively illustrating the first relay module device 1 and the second relay module device 2 viewed from a side of the connector housing 40.

The first relay module device 1 is used for driving a load, such as a lamp, that requires a relatively small normal current as a load current. The second relay module device 2 can be used for driving a load, such as a sheet heater, that requires a relatively large current as a load current, in addition to a lamp or the like. The first relay module device 1 and the second relay module device 2 have a common appearance structure. As illustrated in FIG. 1, the first relay module device 1 and the second relay module device 2 have the appearance structure in which the connector housing 40 is exposed from an opening surface of a casing 3 having a substantially rectangular parallelepiped shape whose one surface is open.

As illustrated in FIG. 2A and FIG. 2B, each of the first relay module device 1 and the second relay module device 2 includes the common circuit substrate 10 and the common connector housing 40. While using the common circuit substrate 10 and the common connector housing 40, the first relay module device 1 uses the connector terminal group 20 as illustrated in FIG. 2A, and the second relay module device 2 uses the connector terminal group 30 as illustrated in FIG. 2B so as to correspond to two kinds having the different load numbers and the different load currents.

Specifically, as illustrated in FIG. 2A and FIG. 2B, the circuit substrate 10 includes a printed circuit board 10a on which a control IC 11, a plurality of switching elements 12a-12f, a plurality of wiring patterns 13a-13g, 14a-14g, a plurality of terminals 15a-15k, and a power source line 16 are mounted.

The control IC 11 can work as a signal converting section. The control IC 11 transmits driving signals for switching the switching elements 12a-12g based on input signals inputted to a plurality of inputs $I_1$-$I_7$. The control IC 11 includes a ROM 11a corresponding to a storing section that stores a data. The control IC 11 determines a relationship between the input signals inputted to the inputs $I_1$-$I_7$ and the driving signals transmitted from the control IC 11 based on the data stored in the ROM 11a.

Specifically, in the first relay module device 1, when input signals different from each other are inputted to the inputs $I_1$-$I_7$, the control IC 11 transmits the driving signals for the respective input signals (hereafter, referred to as a first mode). In other words, the ROM 11a stores a data X that sets a relationship between the input signals and the driving signals to one-to-one. Accordingly, in the first relay module device 1, the driving signals are transmitted for the respective input signals separately inputted the inputs $I_1$-$I_7$ so as to control the switching elements 12a-12g separately.

On the other hand, in the second relay module device 2, a plurality of same driving signals is transmitted with respect to one input signal inputted to a part of the inputs $I_1$-$I_7$ (hereafter, referred to as a second mode). In other words, the ROM 11a stores a data Y that sets a relationship between the input signals and the driving signals to one-to-multiple. However, the relationship between a part of the input signals and the driving signals is one-to-one. Thus, in the second relay module device 2, the control IC 11 transmits one driving signal that corresponds to the input signal inputted to the input $I_1$, transmits three same driving signals that correspond to the input signal inputted to the input $I_2$, and transmits three same driving signals that correspond to the input signal inputted to the input $I_5$. Accordingly, the control IC 11 controls the switching element 12a based on the input signal inputted to the input $I_1$, concurrently controls the switching elements 12b-12d based on the input signal inputted to the input $I_2$, and concurrently controls the switching elements 12e-12g based on the input signal inputted into the input $I_5$. Although input configurations of the input signals from external devices are not illustrated in FIG. 2A and FIG. 2B, as described later, the input signals are transmitted from the external devices to the control substrate 10 using terminal groups 50, 60 inserted into the connector housing 40.

The switching elements 12a-12g work as switches on and off a load current supplied from the power source, based on the driving signals transmitted from the control IC 11. In the present embodiment, the switching elements 12a-12g are formed of MOSFETs. When the driving signals are applied as gate signals to gates of the MOSFETs, the switching elements 12a-12g are turned on and off.

The wiring patterns 13a-13f are wirings pattern-formed on the printed circuit board 10a. The wiring patterns 13a-13g transmit the driving signals from the control IC 11 to the switching elements 12a-12g.

The wiring patterns 14a-14g transmit the load currents supplied from the power source through the switching elements 12a-12g to the terminals 15a-15k. The wiring patterns 14a-14g are respectively connected to the corresponding terminals 15a-15g. The wiring patterns 14b, 14c are branched so as to be connected with the terminals 15h, 15i, respectively, and the wiring patterns 14f, 14g are branched to as to be connected with the terminals 15j, 15k, respectively.

The terminals 15a-15k are connected with the connector terminal group 20 or 30. The terminals 15a-15k are connected to loads through the connector terminal group 20 or 30 so as to supply the load currents from the power source to the loads when the switching elements 12a-12g are turned on. The terminals 15a-15g are first terminals used in the first mode for separately controlling the switching elements 12a-12g. The terminals 15h, 15i are second terminals used in the second mode for supplying the load current to the same load with the terminal 15d, and the terminals 15j, 15k are second terminals used in the second mode for supplying the load current to the same load with the terminal 15e. The terminals 15d, 15e functioning as the first terminals are common terminals used for connection with the connector terminal groups 20, 30 in the first mode and the second mode.

In the present embodiment, the terminals 15h, 15i are disposed closer to the terminal 15d than the terminals 15b, 15c, and are disposed apart from each other so as to secure insulation between the wiring patterns 14b, 14c and the wiring pattern 14d. Similarly, the terminals 15j, 15k are disposed closer to the terminal 15$e$ than the terminals 15$f$, 15$g$, and are disposed apart from each other so as to secure insulation between the wiring patterns 14$f$, 14$g$ and the wiring pattern 14$e$.

The power source line 16 connects the power source and the switching elements 12$a$-12$g$. When the switching elements 12$a$-12$g$ are turned on, the load current from the power source is supplied to the wiring patterns 14$a$-14$g$ through the power source line 16. Although a connection configuration of the power source line 16 with an external device is not illustrated in FIG. 2A and FIG. 2B, as described later, the power source line 16 is connected with the external device using the terminal groups 50, 60 inserted into the connector housing 40.

The circuit substrate 10 is configured as described above. The circuit substrate 10 is commonized between the first relay module device 1 and the second relay module device 2. However, because the relationship between the input signals inputted to the inputs $I_1$-$I_7$ and the driving signals transmitted from the control IC 11 is appropriately set based on the data stored in the ROM 11$a$, a driving mode, that is, a supplying mode of the load currents based on the switching elements 12$a$-12$g$ can be set according to a target product.

The connector terminal group 20 includes connector terminals 20$a$-20$g$. The connector terminal group 30 includes connector terminals 30$a$-30$c$. The connector terminals 20$a$-20$f$, 30$a$-30$c$ work as external output terminals that supply the load currents when the corresponding switching elements 12$a$-12$g$ are turned on. Specifically, one end of each of the connector terminals 20$a$-20$g$, 30$a$-30$c$ is electrically connected with one of the terminals 15$a$-15$k$, and another end of each of the connector terminals 20$a$-20$g$, 30$a$-30$c$ is exposed outside the casing 3 through the connector housing 40 so that each of the connector terminals 20$a$-20$f$, 30$a$-30$c$ can be connected as the external output terminal with the external load. As illustrated in FIG. 3A, FIG. 3B, FIG. 4A, and FIG. 4B, each of the connector terminals 20$a$-20$g$, 30$a$-30$c$ is formed of a frame having a plate shape and a length is larger than a width. Each of the connector terminals 20$a$-20$g$, 30$a$-30$c$ is bent at an intermediate position in a flow direction of electric current (longitudinal direction) and is fitted into the connector housing 40.

The connector terminal group 20 is applied to the first relay module device 1 and is used when the loads are separately driven one by one by the switching element 12$a$-12$g$.

Specifically, the connector terminal group 20 includes the connector terminals 20$a$-20$g$. The connector terminals 20$a$-20$g$ are respectively connected to the terminals 15$a$-15$g$, which are connected with the wiring patterns 14$a$-14$g$ leading to the switching elements 12$a$-12$g$. Thus, the connector terminals 20$a$-20$g$ can control supply of the load currents independently from each other based on on-off states of the switching elements 12$a$-12$g$.

Each of the connector terminals 20$a$-20$g$ can supply only the load current passing through one of the switching elements 12$a$-12$g$. Thus, the first relay module device 1 is used only for driving loads requiring relatively small normal current as the load currents. Because the relatively small electric current flows in each of the connector terminals 20$a$-20$g$, the width may be small. However, the widths of the connector terminals 20$d$, 20$e$ are set to be large so as to correspond to the connector terminals 30$b$, 30$c$.

In the first relay module device 1, the terminals 15$h$-15$k$ are not used and are non-connected terminals not connected with any of the connector terminals 20$a$-20$g$.

The connector terminal group 30 is applied to the second relay module device 2 and is used when one load is driven by two or more of the switching element 12$a$-12$g$ in common.

Specifically, the connector terminal group 30 includes connector terminals 30$a$-30$c$. The connector terminal 30$a$ is connected with the terminal 15$a$, which is connected with the wiring pattern 14$a$ leading to the switching element 12$a$. The connector terminal 30$b$ is connected with the terminals 15$d$, 15$h$, 15$i$, which are connected with the wiring patterns 14$b$-14$d$ leading to the switching elements 12$b$-12$d$. The connector terminal 30$c$ is connected with the terminals 15$e$, 15$j$, 15$k$ connected with the wiring patterns 14$e$-14$g$ leading to the switching elements 12$e$-12$g$. Because the terminals 15$h$, 15$i$ are disposed close to the terminal 15$d$, and the terminals 15$j$, 15$k$ are disposed close to the terminal 15$e$, soldering of the connector terminals 30$b$, 30$c$ for electrical connection can be easily performed. Because of the above-described connection configuration, the supply of the load current can be controlled by the connector terminal 30$a$ based on the on-off state of only one switching element 12$a$. In addition, the supply of the load current can be controlled by the connector terminals 30$b$, 30$c$ based on the on-off states of three switching elements 12$b$-12$d$, 12$e$-12$g$, respectively.

Although the connector terminal 30$a$ can supply the load current passing through only one switching element 12$a$, the connector terminals 30$b$, 30$c$ can supply the load currents passing through three of the switching elements 12$b$-12$g$. Thus, the second relay module device 2 can be used for driving loads requiring relatively large currents in addition to a load requiring a relative small current as the load current. Because relatively large load currents passing through three of the switching elements 12$b$-12$g$ flow in the connector terminals 30$b$, 30$c$, the widths of the connector terminals 30$b$, 30$c$ are set to be large.

In the second relay module device 2, the terminals 15$b$, 15$c$, 15$f$, 15$g$ are not used and are non-connected terminals not connected with any of the connector terminals 30$a$-30$c$. The terminals 15$d$, 15$e$ are the common terminals used in both of the first relay module device 1 set in the first mode and the second relay module device 2 set in the second mode.

The connector housing 40 works as a cover portion fitted into an opening surface of the casing 3 while supporting the connector terminal groups 20, 30 so as to enable external connection. The connector housing 40 is connected with connectors (not shown) connected to the external loads. The connector housing 40 is commonized between the first relay module device 1 and the second relay module device 2. As illustrated in FIG. 5A and FIG. 5B, the connector terminal groups 20, 30 are inserted into through holes 42$a$-42$g$ provided in a partition 41 of the connector housing 40 so as to be exposed outside.

Specifically, dimensions of the through holes 42$a$-42$g$ are set so that the connector terminal groups 20, 30 can be inserted in common. Each of the through holes 42$a$-42$g$ has an elongated shape with one direction as a longitudinal direction so as to correspond to the connector terminals 20$a$-20$g$, 30$a$-30$c$ having the plate shapes. The dimensions in the longitudinal direction of the through holes 42$a$-42$c$, 42$f$, 42$g$ are set to be relatively small so as to correspond to the widths of the connector terminals 20$a$-20$c$, 20$f$, 20$g$, 30$a$. The dimensions in the longitudinal direction of the through holes 42$d$, 42$e$ are set to be larger than the dimensions of the through holes 42$a$-42$c$, 42$f$, 42$g$ so as to correspond to the connector terminals 20$d$, 20$e$, 30$b$, 30$c$.

Thus, in the first relay module device 1, the connector terminals 20a-20c, 20f, 20g are fitted into the through holes 42a-42c, 42f, 42g, whose longitudinal dimensions are relative small, without any gap, and the connector terminals 20d, 20e are fitted into the through holes 42d, 42e, whose longitudinal dimensions are relatively large, without any gap, for example, by press fitting. Accordingly, the connector terminals 20a-20g are supported by the connector housing 40. In the second relay module device 2, the connector terminal 30a is fitted into the through hole 42a, whose longitudinal dimension is relative small, without any gap, and the connector terminals 30b, 30c are fitted into the through holes 42d, 42e, whose longitudinal dimensions are relatively large, without any gap, for example, by press fitting. Accordingly, the connector terminals 30a-30c are supported by the connector housing 40.

Although not described in FIG. 2A, FIG. 2B, as illustrated in FIG. 3A, FIG. 3B, FIG. 4A, FIG. 4B, the circuit substrate 10 is provided with terminal groups 50, 60 in addition to the connector terminal groups 20, 30. As illustrated in FIG. 5A and FIG. 5B, through holes 42a-42f corresponding to the terminal groups 50, 60 are provided in the partition 41 of the connector housing 40.

For example, the first relay module device 1 includes the terminal group 50 that includes input terminals 50a, 50b respectively inputting the inputs $I_1$-$I_3$, $I_4$-$I_7$ as serial signals, a diagnosis terminal 50c for self-diagnosis, connection terminals 50d, 50e for ground connection, and a power source terminal 50f connected with the power source line 16. The second relay module device 2 includes the terminal group 60 that includes input terminals 60a, 60b inputting the input and the inputs $I_2$, $I_5$ as serial signals, a diagnosis terminal 60c for self-diagnosis, connection terminals 60d, 60e for ground connection, and a power source terminal 60f connected with the power source line 16.

Similarly to the connector terminals 20a-20g, 30a-30c, the terminals 50a-50f, 60a-60f are formed of frames having plate shapes. In the terminal groups 50, 60, the terminals 50a-50e, 60a-60e other than the power source terminals 50f, 50f are signal terminals in which only relatively small current flow. Thus, the terminals 50a-50e, 60a-60e have small widths. However, because large currents in which the load currents are combined may flow in the power source terminals 50f, 60f, the widths of the power source terminals 50f, 60f are larger than the other terminals 50a-50e, 60a-60e. The through holes 43a-43e are configured so that the terminal groups 50, 60 can be inserted in common. The terminal groups 50, 60 are fitted into the through holes 43a-43e without any gap so as to be supported by the connector housing 40.

The connector terminals 20a-20g, 30a-30c and the terminal groups 50a-50g, 60a-60f are press-fitted into the corresponding through holes 42a-42g, 43a-43e in the connector housing 40, and after that, the connector terminals 20a-20g, 30a-30c and the terminals 50a-50f, 60a-60f are soldered to the corresponding terminals 15a-15k and the like in the circuit substrate 10. The above-described method can restrict issues that soldering becomes difficult due to inclination of the terminals 15a-15k and the like and a junction failure is generated by a stress applied to a soldered portion, which may be caused when the connector terminals 20a-20g, 30a-30c and the terminals 50a-50f, 60a-60f are press-fitted into the corresponding through holes 42a-42g, 43a-43g after soldered to the corresponding terminals 15a-15k and the like.

The first relay module device 1 and the second relay module device 2 are configured as described above. Because each of the first relay module device 1 and the second relay module device 2 includes the control IC 11 that can store the data for setting the relationship between the inputs $I_1$-$I_7$ as the input signals from outside and the driving signals of the switching elements 12a-12g, the first mode in which the switching elements 12a-12g can be on-off controlled by one by and the second mode in which some of the switching elements 12a-12g can be concurrently on-off controlled can be set. Accordingly, although the load numbers and the load currents are different, the circuit substrate 10 can be commonized between the first relay module device 1 and the second relay module device 2.

Thus, it is not necessary to prepare new components in accordance with the load number and the load current and to make layout designs of the circuit substrate 10 for the first relay module device 1 and the second relay module device 2, respectively. Thus, a manufacturing cost can be reduced. In addition, it is not necessary to change the wiring patterns 13a-13g, 14a-14g included in the circuit substrate 10, and influence to a vehicle noise (emission and immunity) changes little. Thus, a further evaluation is not necessary, and increase in time and cost for product development can be restricted.

In addition, the dimension (the width) of each of the connector terminals 20a-20g, 30a-30c is set based on the magnitude of the load current, and the dimensions of the through holes 42a-42g formed in the connector housing 40 are set so as to correspond to the dimension of the connector terminals 20-20g, 30a-30c. In the through holes 42a-42g formed in the connector housing 40, the dimensions of the through holes 42d, 42e to which the connector terminals 30b, 30c included in the second relay module device 2 and having relatively large dimensions are set to be larger than the other through holes 42a-42c, 42f, 43g. In addition, the dimensions of the connector terminals 20c, 20d included in the first relay module device 1 and fitted into the through holes 42d, 42e are same as the dimensions of the connector terminals 30b, 30c. In other words, because the connector terminals 20c, 20d in which small currents flow are fitted into the through holes 42d, 42e same as the terminals 30b, 30c in which large currents flow, the dimensions of portions fitted into the through holes 42d, 40e in the connector terminals 20c, 20d are set to be the same as the dimensions of portions fitted into the through holes 40d, 40e in the connector terminals 30b, 30c.

Accordingly, the connector housing 40 can be commonized between the first relay module device 1 and the second relay module device 2. Thus, it is not necessary to prepare different molding tools for manufacturing the connector housing 40, and increase in manufacturing cost can be restricted.

Other Embodiments

The present disclosure is not limited to the above-described embodiments, and the various changes and modifications can be made within the scope of the present disclosure.

For example, in the above-described embodiment, as a mode in which a large current flows when concurrently controlling some of the switching elements 12a-12g, the three switching elements 12b-12d or the three switching elements 12e-12g are concurrently controlled in the second relay module device 2. However, the above-described mode is a mere example, and two switching elements or more than three switching elements may also be concurrently controlled.

The second relay module device 2 can supply electric current to both of the load supplied with the normal current and the load supplied with the large current. A relay module device according to another embodiment may be configured so as to supply electric current only to loads supplied with large currents. A relay module device according to another embodiment may be configured so as to supply electric current to loads for which the number of switching elements concurrently controlled are different. These relay module devices may be formed using the circuit substrate 10 if the shapes of the connector terminal groups 20, 30, and the connector housing 40 are changed. Thus, the circuit substrate 10 can be commonized. In this case, there is a possibility that the connector housing 40 cannot be commonized because an insert for resin molding the connector housing 40 is changed. However, because the circuit substrate 10 is commonized, effects by the commonization of at least the circuit substrate 10 can be obtained.

What is claimed is:

1. A relay module device comprising:
   a circuit substrate including a plurality of switching elements, a plurality of first wiring patterns, a plurality of second wiring patterns, a plurality of output terminals, and a signal converting section,
   the switching elements controlling a plurality of load currents supplied from a power source to a plurality of loads,
   the first wiring patterns transmitting driving signals from the signal converting section to the switching elements,
   the second wiring patterns transmitting the load currents from the switching elements to the output terminals,
   the output terminals connected with the second wiring patterns,
   the signal converting section transmitting the driving signals when receiving input signals from an external device and setting a relationship between the input signals and the driving signals,
   the relationship including
   a first mode in which the signal converting section transmits the driving signals to separately control one of the switching elements with respect to one of the input signals, and
   a second mode in which the signal converting section transmits the driving signals to concurrently control two or more of the switching elements with respect to one of the input signals;
   a plurality of connector terminals each having an end connected with one of the output terminals of the circuit substrate and another end for external connection; and
   a connector housing having a plurality of through holes into which the connecter terminals are fitted, wherein
   the output terminals include a first terminal, a second terminal, and a common terminal,
   a part of the second wiring patterns is branched in the circuit substrate so as to be connected with the first terminal and the second terminal,
   the first terminal and the common terminal are separately connected with the connector terminals in the first mode, and
   the second terminal and the common terminal are connected with one of the connector terminals in common in the second mode.

2. The relay module device according to claim 1, wherein the signal converting section is a control IC including a storing section that stores data, and the control IC sets the relationship between the input signals and the driving signals based on the data stored in the storing section.

3. The relay module device according to claim 1, wherein a part of the second wiring patterns connected with the switching elements that are concurrently controlled in the second mode is branched so as to be connected with the first terminal and the second terminal, and the second terminal is disposed closer to the common terminal than the first terminal.

4. The relay module device according to claim 3, wherein a dimension of a portion fitted into the through hole in the connector terminal connected with the common terminal and the second terminal in the second mode is same as a dimension of a portion fitted into the through hole in the connector terminal connected with the common terminal in the first mode, and the connector housing is commonized between the first mode and the second mode.

5. The relay module device according to claim 1, wherein the second terminal is not connected to the connector terminals in the first mode.

6. The relay module device according to claim 5, wherein the first terminal is not connected to the connector terminals in the second mode.

7. The relay module device according to claim 1, wherein the first terminal is not connected to the connector terminals in the second mode.

8. The relay module device according to claim 1, wherein the first terminal includes four separate terminals.

9. The relay module device according to claim 8, wherein the second terminal includes four separate terminals.

10. The relay module device according to claim 9, wherein the common terminal includes two separate terminals.

11. The relay module device according to claim 1, wherein the second terminal includes four separate terminals.

12. The relay module device according to claim 11, wherein the common terminal includes two separate terminals.

13. The relay module device according to claim 1, wherein the common terminal includes two separate terminals.

14. The relay module device according to claim 1, wherein the part of the second wiring patterns is branched so as to be connected to only the first and second terminals.

* * * * *